(12) United States Patent
Wu et al.

(10) Patent No.: US 11,875,835 B2
(45) Date of Patent: Jan. 16, 2024

(54) MEMORY AND READ AND WRITE METHODS OF MEMORY

(71) Applicant: CHANGXIN MEMORY TECHNOLOGIES, INC., Anhui (CN)

(72) Inventors: Baolei Wu, Hefei (CN); Yulei Wu, Hefei (CN); Xiaoguang Wang, Hefei (CN); Erxuan Ping, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 305 days.

(21) Appl. No.: 17/310,385

(22) PCT Filed: Nov. 20, 2020

(86) PCT No.: PCT/CN2020/130383
§ 371 (c)(1),
(2) Date: Jul. 29, 2021

(87) PCT Pub. No.: WO2021/208436
PCT Pub. Date: Oct. 21, 2021

(65) Prior Publication Data
US 2022/0319565 A1 Oct. 6, 2022

(30) Foreign Application Priority Data
Apr. 16, 2020 (CN) .......................... 202010299470.8

(51) Int. Cl.
*G11C 11/16* (2006.01)

(52) U.S. Cl.
CPC ........ *G11C 11/1675* (2013.01); *G11C 11/161* (2013.01); *G11C 11/1659* (2013.01)

(58) Field of Classification Search
CPC .............. G11C 11/1675; G11C 11/161; G11C 11/1659; G11C 11/1655; G11C 11/1657;
(Continued)

(56) References Cited

U.S. PATENT DOCUMENTS 6,451,625 B1 9/2002 Pu et al.
9,830,968 B2 11/2017 Shimomura et al.
(Continued)

FOREIGN PATENT DOCUMENTS

WO 2017034563 A1 3/2017

OTHER PUBLICATIONS

International Search Report in Application No. PCT/CN2020/130383, dated Feb. 24, 2021.
(Continued)

*Primary Examiner* — Ajay Ojha
(74) *Attorney, Agent, or Firm* — Syncoda LLC; Feng Ma (57) ABSTRACT

A memory and a read and write method of memory can prevent the magnetic random-access memory (MRAM) from being easily damaged or degraded by excessive write current during use, and increase memory integration density. The memory includes: a storage unit, comprising a storage element; a source line, electrically connected to a first end of the storage element; the memory is configured to change a storage state of the storage element by a first current and a second current, the first current flowing through the storage element and the second current flowing through the source line without flowing through the storage element.

14 Claims, 3 Drawing Sheets

(58) Field of Classification Search
CPC ............ G11C 11/1673; G11C 11/1693; G11C 11/1697
See application file for complete search history.

(56) References Cited

U.S. PATENT DOCUMENTS

| | | |
|---|---|---|
| 10,026,465 B2 | 7/2018 | Inokuchi et al. |
| 10,211,393 B2 | 2/2019 | Mihajlovic et al. |
| 10,388,344 B2 | 8/2019 | Zhao et al. |
| 10,460,785 B1 | 10/2019 | Lee et al. |
| 10,600,465 B1 | 3/2020 | Araki |
| 2013/0070521 A1 | 3/2013 | El Baraji et al. |
| 2014/0056060 A1* | 2/2014 | Khvalkovskiy ..... G11C 11/1675 365/158 |
| 2018/0277184 A1* | 9/2018 | Zhao ................... G11C 11/161 |

OTHER PUBLICATIONS

Extended European Search Report in Application No. 20931052.3, dated Oct. 20, 2022.
Kang Wang et al: Low Store Power High-Speed High-Density Nonvolatile SRAM Design With Spin Hall Effect-Driven Magnetic Tunnel Junctions, IEEE Transactions on Nanotechnology, vol. 16, No. 1, Jan. 2017.

* cited by examiner

MEMORY AND READ AND WRITE METHODS OF MEMORY

CROSS-REFERENCE TO RELATED APPLICATIONS

This application is a national stage of International Application No. PCT/CN2020/130383 filed on Nov. 20, 2020, which claims priority to Chinese Patent Application No. 202010299470.87 filed on Apr. 16, 2020. The disclosures of these applications are hereby incorporated by reference in their entirety.

TECHNICAL FIELD

The present disclosure relates to the field of memory, and in particular to a memory and a read and write method of a memory.

BACKGROUND

MRAM(Magnetic Random Access Memory) is a non-volatile magnetic memory capable of high speed action. MRAM has been extensively studied due to its advantages such as non-volatility, random access, fast access speed, and so on.

The MRAM in the prior art has at least the following insurmountable problems in that the MRAM is easy to damage the magnetic tunnel junction or degradation due to excessive write current during use, thereby affecting the performance and reliability of the MRAM. There is an urgent need to propose a new memory to overcome the above-mentioned problems.

SUMMARY

The purpose of the present disclosure is to provide a memory and a read and write method of a memory, which can prevent the MRAM from easily affecting performance and reliability of the device due to excessive current during use, and has a greater memory integration density.

In order to solve the above technical problem, the following provides a memory comprising: a storage unit, comprising a storage element; a source line, electrically connected to a first end of the storage element; the memory is configured to change a storage state of the storage element by a first current and a second current, the first current flowing through the storage element and the second current flowing through the source line without flowing through the storage element.

Optionally, the memory further comprises: a bit line; the storage unit also includes a first selective transistor, the first selective transistor configured to electrically connect a second end of the storage element with the bit line in response to a first control signal.

Optionally, the memory further comprises: a write bit line; a second selective transistor, configured to electrically connect a first end of the source line with the write bit line in response to a second control signal.

Optionally, the first current flows from the bit line to the source line and through the storage element when writing 1, and the first current flows from the source line to the bit line and through the storage unit when writing 0.

Optionally, the second current flows from a first end of the source line to a second end of the source line when writing 1, and the second current flows from the second end of the source line to the first end of the source line when writing 0.

Optionally, the memory further comprises: a third selective transistor, configured to transmit a high level or a low level signal to a second end of the source line in response to a third control signal.

Optionally, the memory is further configured to provide a high level or a low level to the second end of the storage element by using the bit line, when the second end of the storage element is electrically connected with the bit line.

Optionally, the memory is further configured to provide a high level or a low level to the first end of the source line by using the write bit line, when the first end of the source line is electrically connected with the write bit line.

Optionally, the memory is further configured to provide a high level or a low level to a second end of the source line.

Optionally, the memory comprises: a plurality of the storage units and a first end of the storage element in each of the storage units is connected to the source line.

Optionally, the memory is configured to read data stored within the storage element through a third current flowing from the bit line to a second end of the source line through the storage element.

Optionally, the bit line is configured to be electrically connected to the second end of the storage element and provide a high level to the second end of the storage element when reading, and the second end of the source line is configured to be at a low level when reading.

Optionally, the storage element comprises a magnetic tunnel junction.

Optionally, the magnetic tunnel junction comprises: a free layer connected to the source line; a non-magnetic isolation layer disposed on an upper surface of the free layer; a fixed layer disposed on an upper surface of the non-magnetic insulating layer; a direction of a magnetic moment of the free layer is variable and a direction of a magnetic moment of the fixed layer is fixed; the first selective transistor is connected to the fixed layer.

In order to solve the above problems, the following also provides a read and write method of a memory, the memory comprises a storage unit, the storage unit comprises a storage element, the memory configured to change a memory state of the storage element by a first current and a second current, the memory further comprising a source line electrically connected a first end of the storage element, and when performing a write operation on the memory, the method comprises: providing a first current to the memory; providing a second current to the memory; wherein the first current flows through the storage element and the second current flows through the source line without flowing through the storage element.

Optionally, the memory further comprises a bit line capable of providing a high level or a low level to the storage unit, and the storage unit further comprises a first selective transistor, and when performing a write operation on the memory, the method further comprises: controlling the first selective transistor by a first control signal, the first selective transistor electrically connecting a second end of the storage element with the bit line in response to the first control signal.

Optionally, the memory further comprises a write bit line capable of providing a high level or a low level, the memory further comprises a second selective transistor, and when performing a write operation on the memory, the method further comprises: controlling the second selective transistor by a second control signal, the second selective transistor electrically connecting a first end of the source line with the write bit line in response to the second control signal.

Optionally, the memory further comprises a third selective transistor, and when performing a write operation on the memory, the method further comprises: controlling the third selective transistor by a third control signal such that the third selective transistor transmits a high level or a low level signal to the second end of the source line in response to the third control signal.

Optionally, the first current provided to the memory flows from the bit line to the source line and through the storage element when writing 1; and the first current flows from the source line to the bit line through the storage element when writing 0.

Optionally, the second current provided to the memory flows from the write bit line to a second end of the source line when writing 1; and the second current flows from a second end of the source line to the write bit line when writing 0.

Optionally, the read and write method further comprises performing a read operation on the memory, the read operation comprising providing a third current to the memory, the third current flowing from the bit line to a second end of the source line through the storage element.

The memory and the read and write method of the memory of the present disclosure are provided by controlling the voltage relationship between the three terminals of the memory, to control current flow through the memory. A first current flowing through the storage unit and a second current not flowing through the storage unit are used to control the storage state of the storage unit, which avoids degradation of memory performance and reliability resulting from using only one large current through the storage unit to control the storage state of the storage device. In addition, the memory and the read and write method of the memory may enable read and write of data on the same storage unit with greater integration density and access speed.

DESCRIPTION OF EMBODIMENTS

It was found that in MRAM, a Magnetic Tunnel Junction (MTJ) element can be used as a storage element. The basic structure of the MTJ element has 3 layers of magnetic layer/insulating layer/magnetic layer, one magnetic layer is referred to as the free layer and the other magnetic layer is referred to as the fixed layer. In addition, the intermediate insulating layer is referred to as a tunnel barrier layer or a non-magnetic isolation layer.

In general, the magnetic moment direction (or magnetization direction) of the fixed layer is fixed, while the magnetic moment direction of the free layer is variable, which is typically parallel to or antiparallel to the magnetic moment direction of the fixed layer. When the magnetic moment directions of the free layer and the fixed layer are parallel, the MTJ element is in the low resistance state, and when the magnetic moment directions of the free layer and the fixed layer are anti-parallel, the MTJ element is in the high resistance state. MRAM can realize the storage of a binary 0 or 1 by changing the direction of the magnetic moment of the free layer in the MTJ element.

An MRAM based on STT (Spin Transfer Torque) principle, that is, STT-MRAM, is used in the prior art to control the magnetization direction of the free layer. The writing principle of the STT-MRAM is to provide a write current from the free layer to the fixed layer or from the fixed layer to the free layer via the tunnel barrier layer, the magnetization direction of the free layer relative to the magnetization direction of the fixed layer is changed to be parallel or anti-parallel by the spin current, thereby realizing a write operation to the MTJ element.

Since the write current of the STT-MRAM needs to pass through the tunnel barrier layer, excessive write current of the MRAM for multiple times during use may damage the tunnel barrier layer, thereby affecting performance and reliability of the MRAM. In addition, reading the data in the STT-MRAM also generates a read current through the MTJ element, which may increase in the case of the tunnel barrier layer being damaged, and a false write operation (mismagneting the free layer) may occur due to the presence of the STT effect.

A MRAM based on SHE (Spin Hall Effect) principle, that is, SHE-MRAM, is also used in the prior art to obtain relatively high read and write times, however, the SHE-MRAM has to be based on the design of a three-terminal device leading to a problem of not having a high storage density.

A memory and a read and write method of the memory of the present disclosure are described in further detail below with reference to the accompanying drawings and detailed description.

Figure 1:
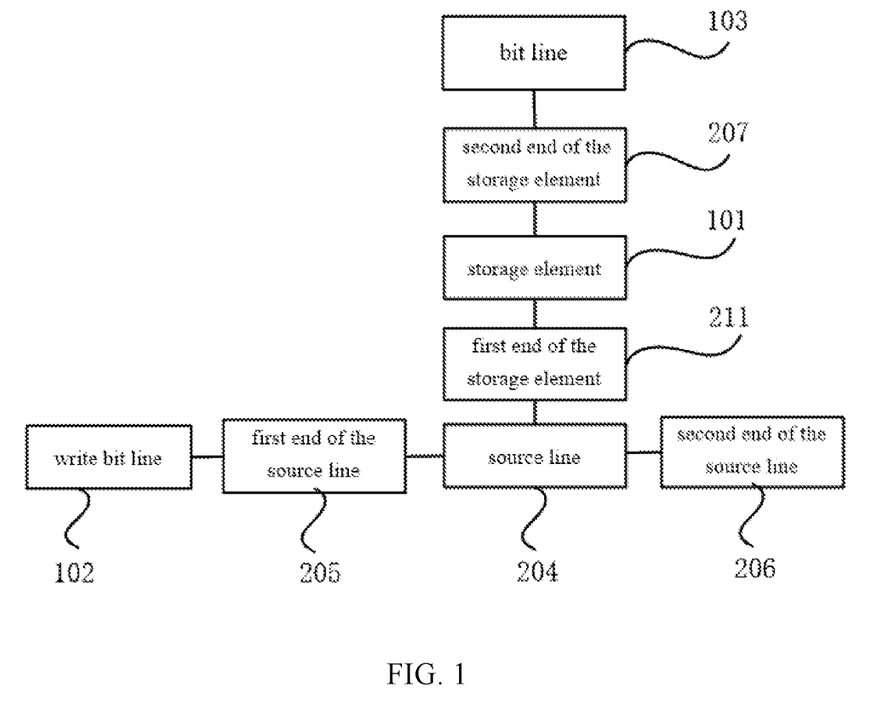
FIG. 1 is a schematic diagram of a connection structure of a memory in accordance with a specific implementation of the present disclosure.
Figure 2:
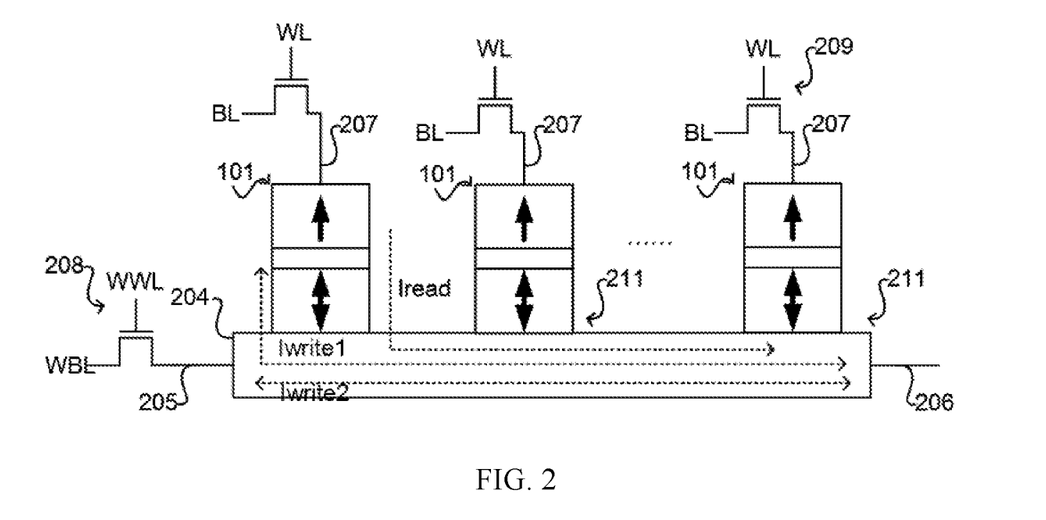
FIG. 2 is a schematic diagram of a connection structure of a memory in accordance with a specific implementation of the present disclosure.
Figure 4:
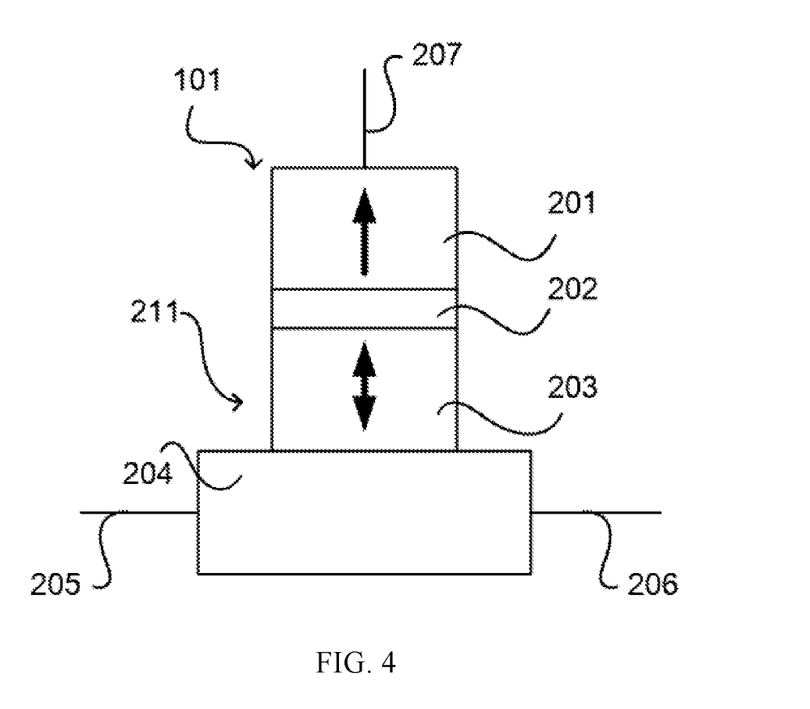
FIG. 4 is a schematic diagram of the connection structure of a memory in accordance with a specific implementation of the present disclosure.

Referring now to FIGS. 1, 2, and 4, wherein FIG. 1 is a schematic diagram of a connection structure of a memory in accordance with an implementation of the present disclosure, FIG. 2 is a schematic diagram of a connection structure of a memory in accordance with an implementation of the present disclosure, and FIG. 4 is a schematic diagram of a connection structure of a memory in accordance with an embodiment of the present disclosure.

In the specific implementations illustrated in FIGS. 1, 2 and 4, which provides a memory comprising: a storage unit comprising a storage element 101; a source line 204 electrically connected to a first end 211 of the storage element 101; the memory is configured to change a storage state of the storage element 101 by a first current Iwrite1 flowing through the storage element 101 and a second current Iwrite2 flowing through the source line 204 without flowing through the storage element 101.

In a specific implementation shown in FIGS. 1, 2, and 4, the memory is capable of reading and writing data on the same storage element 101, with a higher integration density of a memory, and a faster access speed.

In this specific implementation, since the first current Iwrite1 and the second current Iwrite2 are used simultaneously to control write 1 and write 0, and the second current Iwrite2 does not pass through the storage element 101, the current flowing through the storage element 101 during a write operation is reduced, guaranteeing that the current passing through the storage element 101 during writing is not too large, guaranteeing long-term reliability of the memory.

In a specific implementation, the second end 207 of the storage element 101 is configured to be a high level when writing 1, the first end 205 of the source line 204 is configured to be a high level, the second end 206 of the source line 204 is configured to be a low level, and current conditions in the memory correspond to the conditions of the first current Iwrite1 and the second current Iwrite2 when writing 1; when writing 0, the second end of the storage element 101 is configured to be a low level, the first end 205 of the source line 204 is configured to be a low level, the second end 206 of the source line 204 is configured to be a high level, and current conditions in the memory correspond to the conditions of the first current Iwrite1 and the second current Iwrite2when writing 0.

In a specific implementation, the source lines 204 are prepared from conductive materials, such as metals such as platinum, tantalum, topological insulators such as $Bi_2Se_3$, as well as semi-metallic materials $MoTe_2$ and chalcogenide materials $Bi_xTe_{1-x}$, or combinations thereof. It should be clear to those skilled in the art that the materials from which the source lines 204 are made may be selected as desired.

In a specific implementation, the connection of the source line 204 to the first end 211 of the storage element 101 may be a direct connection or a connection through other contact structures. It will be clear to those skilled in the art that the connection of the source line 204 to the first end 211 of the storage element 101 can be selected as desired.

Figure 3:
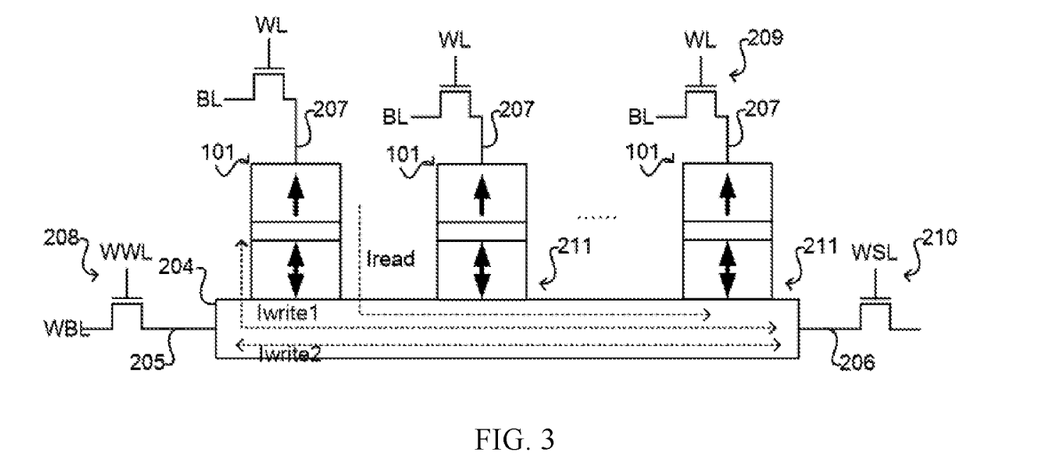
FIG. 3 is a schematic diagram of a connection structure of a memory in accordance with a specific implementation of the present disclosure.
Figure 5:
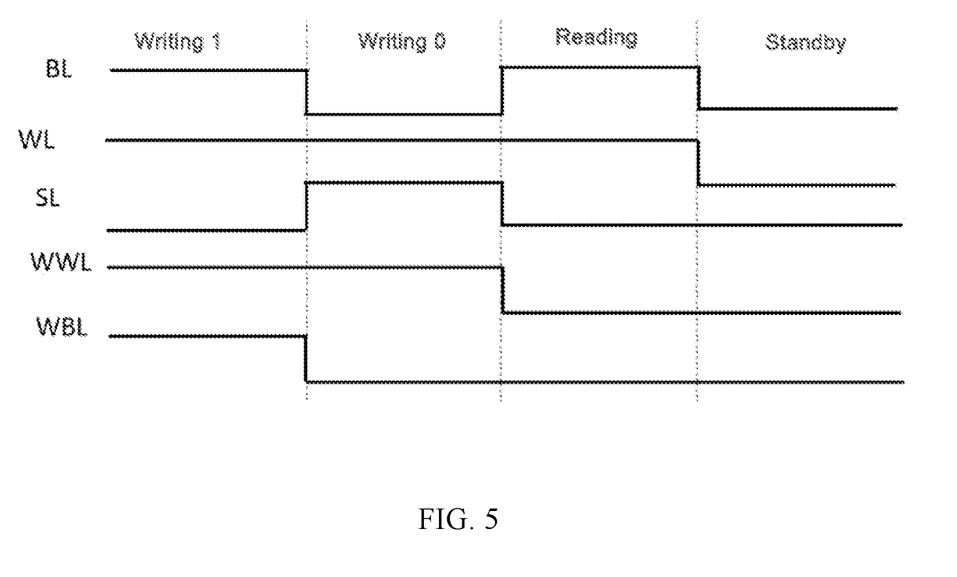
FIG. 5 is a schematic timing diagram of read and write operations of a memory in accordance with a specific implementation of the present disclosure.

In a specific implementation, the memory further comprises: a bit line 103, it is noted that a bit line 103 is labeled as BL in FIGS. 2, 3, 5; the storage unit further includes a first selective transistor 209 configured to electrically connect a second end 207 of the storage element 101with a bit line 103 in response to a first control signal, which may be a word line, labeled as WL in FIGS. 2, 3, and 5.

In a specific implementation, the memory is further configured to provide a high level or a low level to the second end 207 of the storage element 101 using the bit line 103 when the second end 207 of the storage element 101 is electrically connected to the bit line 103. Thus, the first selective transistor 209 can act as a switch between the second end 207 of the storage element 101 and a high level or a low level.

In a specific implementation, the gate of the first selective transistor 209 is connected to the first control signal. In a specific implementation, the first selective transistor 209 is an NMOS transistor. In another specific implementation, the first selective transistor 209 can also be a PMOS transistor, CMOS switch, or the like, which can be selected by those skilled in the art on their own as desired.

In a specific implementation, the first selective transistor 209 is configured to electrically connect the second end 207 of the storage element 101 with the bit line 103 in response to the first control signal in a writing state, and the bit line 103 is configured to provide a high level for the second end 207 of the storage element 101 when writing 1 and a low level for the second end 207 of the storage element 101 when writing 0.

In a specific implementation, the memory further comprises: a write bit line 102, it is noted that a write bit line 102 is labeled as WBL in FIGS. 2, 3, 5; a second selective transistor 208 configured to electrically connect a first end 205 of the source line 204 with a write bit line 102 in response to a second control signal, which may be a Write word line, labeled as WWL in FIGS. 2, 3, and 5.

In a specific implementation, the memory is further configured to provide a high level or a low level to the first end 205 of the source line 204 using the write bit line 102 when the first end 205 of the source line 204 is electrically connected to the write bit line 102.

In a specific implementation, the gate of the second selective transistor 208 is connected to the second control signal. In a specific implementation, the second selective transistor 208 is an NMOS transistor. In another specific implementation, the second selective transistors 208 are PMOS transistors, CMOS switches, or the like, which can be selected by those skilled in the art on their own as desired.

In a specific implementation, the second selective transistor 208 is configured to electrically connect the first end 205 of the source line 204 with the write bit line 102 in response to the second control signal while in a writing state, and the write bit line 102 is configured to provide a high level for the first end 205 of the source line 204 when writing 1 and provide a low level for the first end 205 of the source line 204 when writing 0.

Referring to FIG. 3, in a specific implementation, the memory further includes a third selective transistor 210 configured to transmit a high level or low level signal to the second end 206 of the source line 204 in response to a third control signal, labeled as WSL in FIG. 3.

As shown in FIG. 3, the gate of the third selective transistor 210 is connected to the third control signal. In a specific implementation, the third selective transistor 210 is an NMOS transistor. In another specific implementation, the third selective transistors 210 are PMOS transistor s, CMOS switches, or the like, which can be selected by those skilled in the art on their own as desired.

In a specific implementation, the third selective transistor 210 is configured to transmit a low level to the second end 206 of the source line 204 when writing 1 and a high level to the second end 206 of the source line 204 when writing 0 in response to the third control signal when in a write state.

In a further specific implementation, the third selective transistor 210 may not be provided, instead, the second end of the source line 204 may be directly provided with a high or low level, see FIG. 2.

In a specific implementation, the first current Iwrite1 flows from the bit line to the source line 204and through the storage element, i.e. from the second end 207 of the storage element 101 to the second end 206 of the source line 204 when writing 1, and flows from the source line 204 to the bit line and through the storage unit, i.e., from the second end 206 of the source line 204 to the second end 207 of the storage element 101 when writing 0. The second current Iwrite2 flows from the first end 205 of the source line 204 to the second end 206 of the source line 204 when writing 1 and flows from the second end 206 of the source line 204 to the first end 205 of the source line 204 when writing 0.

In a specific implementation, the memory is configured to read data stored in the storage element 101 via a third current Iread flowing from the bit line 103 to the second end 206 of the source line 204 and through the storage element 101. The memory is configured to provide a high level to the second end 207 of the storage element 101 and a low level to the second end 206 of the source line 204 when reading. With a voltage difference between the second end 207 of the storage element 101 and the second end 206 of the source line 204, there is a current flowing in a direction from the second end 207 of the storage element 101 to the second end 206 of the source line 204.

Note that when reading, the write bit line 102 is configured not to be electrically connected to the first end 205 of the source line 204. This may be achieved by controlling the second control signal to be a low level. In this case, the second selective transistor 208 is turned off and cannot affect the third current Tread in the memory regardless of whether the write bit line 102 is at a high level or a low level.

In the specific implementation shown in FIG. 3, selective transistors are provided between the bit line 103 and the second end 207 of the storage element 101, between the write bit line 102 and the first end 205 of the source line 204, between the second end 206 of the source line 204 and a high level or a low level signal. The memory can be placed in a standby state by turning off the first selective transistor 209, second selective transistor 208, and third selective transistor 210. In the standby state, there is no current in the memory.

Note that the high level and low level mentioned in the present disclosure are relative concepts, which do not limit a specific voltage value of a high level nor a specific voltage value of a low level, and do not limit that all of the high levels in the present disclosure are equal, e.g., the high level on the bit line 103 and the high level on the write bit line 102 may be different voltages, and do not limit that the high levels on the same location at different phases are equal, e.g., the high level applied on the bit line 103 at the state of writing 1 state and the read state may be different voltage values. It will be understood by those skilled in the art that the values of the respective high and low levels may be set on their own depending on process nodes, speed requirements, reliability requirements, and the like.

Referring now to FIG. 5, in the specific implementation shown in FIG. 5, SL represents a change in voltage at the second end 206 of the source line 204, FIG. 5 is a timing diagram of read and write operations of a memory in accordance with an specific implementation of the present disclosure. In addition, in FIG. 5 no third selective transistor 210 is provided and thus no third control signal is present, but a person skilled in the art will be able to unambiguously derive the timing of the operations wherein the third selective transistor 210 is provided from the above text description. In this specific implementation, both the first selective transistor 209 and the second selective transistor 208 are NMOS transistors.

In FIG. 5, when writing 1, the first control signal and second control signal are both at a high level, the first selective transistor 209 and the second selective transistor 208 are both turned on, the bit line 103 provides a high level to the second end 207 of the storage element 101, and the write bit line 102 provides a high level to the first end 205 of the source line 204. The second end 206 of the source line 204 is at a low level. At this time, there is a first current Iwrite1 flowing from the second end 207 of the storage element 101 to the second end 206 of the source line 204, and there is also a second current Iwrite2 flowing from the first end 205 of the source line 204 to the second end 206 of the source line 204.

In FIG. 5, when writing0, the first control signal and second control signal are still at a high level, the first selective transistor 209 and the second selective transistor 208 are still turned on, the bit line 103 provides a low level to the second end 207 of the storage element 101, and the write bit line 102 provides a low level to the first end 205 of the source line 204. The second end 206 of the source line 204 is at a high level. At this time, there is a first current Iwrite1 flowing from the second end of the source line 204 to the second end 207 of the storage element 101, and there is also a second current Iwrite2 flowing from the second end of the source line 204 to the first end 205 of the source line 204.

In FIG. 5, while reading, the first control signal is still at a high level and the second control signal is at a low level. At this time, the first selective transistor 209 is turned on, the second selective transistor 208 is turned off, and the second end 206 of the source line 204 is connected to a low level. At this time, the memory state of the storage element 101 is obtained by detecting the magnitude of a third current Iread flowing from the second end 207 of the storage element 101 to the second end 206 of the source line 204.

In the specific implementation shown in FIG. 5, there is the standby state. In the standby state, the first control signal and second control signal are both at a low level such that the first selective transistor 209 and second selective transistor 208 are both turned off, the second end 206 of the source line 204 is at a low level, there is no voltage difference among the three ports of the memory, and no current flows within the memory. In the specific implementation with a third selective transistor 210 shown in FIG. 3, the third control signal for controlling the third selective transistor 210 is also at a low level and the third selective transistor 210 is also turned off.

In a specific implementation, the storage element 101 comprises a magnetic tunnel junction. In a specific implementation, the magnetic tunnel junction includes: a free layer 203 connected to the source line 204; a non-magnetic isolation layer 202 disposed on an upper surface of the free layer 203; a fixed layer 201 disposed on an upper surface of the non-magnetic insulating layer; the direction of the magnetic moment of the free layer 203 is variable and the direction of the magnetic moment of the fixed layer 201 is fixed; the first selective transistor 209 is connected to the fixed layer 201. It will be appreciated by those skilled in the art that the position of the free layer 203 and the position of the fixed layer 201 may also be changed and may be set as desired.

In a specific implementation, the non-magnetic isolation layer 202 includes at least one of a non-magnetic insulating layer or a non-magnetic metal layer. Indeed, the specific structure of the non-magnetic isolation layer 202 may be provided as desired.

In the specific implementation shown in FIGS. 2 and 3, when writing1, the direction of current flows from the second end 207 of the storage element 101 to the first end 211 of the storage element 101, the magnetic moment direction of the free layer 203 is a first direction; whenwriting0, the current flows from the first end of the storage element 101 to the second end 207 of the storage element 101, and the direction of the magnetic moment of the free layer 203 is a second direction. Since the resistance of the magnetic tunnel junction is different when the direction of the magnetic moment of the free layer 203 is changed, reading can be performed according to characteristics of different resistances in two cases when reading data stored in the storage element 101.

In the specific implementations shown in FIGS. 1 to 5, a first current Iwrite1 flowing through the storage element 101 and a second current Iwrite2 not flowing through the storage element 101 are used simultaneously to change the storage state of the storage element 101. The problem of excessive current when only using the STT current for writing is avoided, i.e., damage or degradation of the storage element 101 caused by applying a large current on the storage element 101 is avoided, thereby avoiding the influences on the performance and reliability of the memory.

Referring to FIGS. 2 and 3, the memory includes a plurality of storage units, and the first end of the storage element 101 in each of the storage units is connected to the source line 204. Such a structure using common source line may increase storage density. In this specific implementation, the more storage units the memory contains, the more data the memory can store, and the greater the capacity of the memory is.

In a specific implementation, the plurality of storage units form an array, each row of storage units is arranged to a source line 204, each row of storage units is connected to a bit line 103, and the bit lines are connected with each other, and the first selective transistors 209 of each column of storage units are connected to a same control line. The controlling of the read and write operations performed on a certain storage unit may be achieved by controlling a certain source line 204, a certain control line, a certain bit line 103, etc. in the array.

Figure 6:
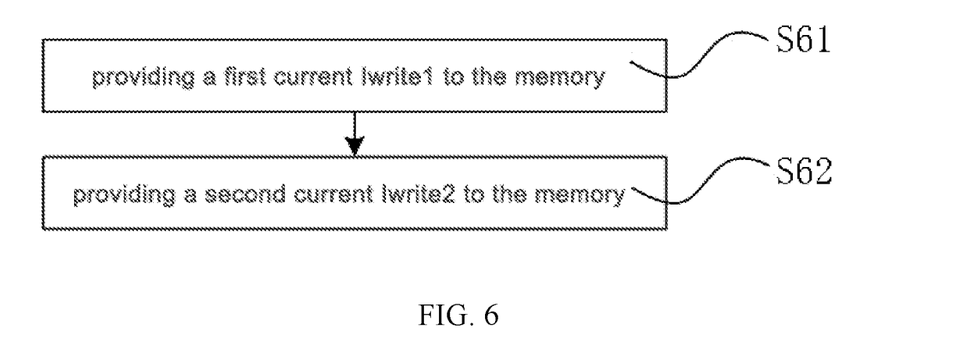
FIG. 6 is a flowchart illustrating steps of a method for reading and writing to a memory in accordance with a specific implementation of the present disclosure.

Referring now to FIGS. 1 to 6, wherein, FIG. 6 is a flowchart illustrating steps of a read and write method for a memory. In this specific implementation, the memory comprises a storage unit, the storage unit comprises a storage element 101, the memory is configured to change a storage state of the storage element 101 by a first current Iwrite1 and a second current Iwrite2, the memory further comprises a source line 204 electrically connecting a first end 211 of the storage element 101, and when performing a write operation on the memory, the method comprises: S61 providing a first current Iwrite1 to the memory; S62 providing a second current Iwrite2 to the memory; wherein the first current Iwrite1 flows through the storage element 101 and the second current Iwrite2 flows through the source line 204 without flowing through the storage element 101.

In the specific implementation shown in FIGS. 1, 2, and 4, the memory is capable of reading and writing data on a same storage element 101, with a higher memory integration density, and a faster access speed.

In a specific implementation, the memory further includes: a bit line 103; the storage unit further includes a first selective transistor 209 configured to electrically connect a second end 207 of the storage element 101 with the bit line 103 in response to a first control signal. The memory is further configured to provide a high level or a low level to the second end 207 of the storage element 101 with the bit line 103 when the second end 207 of the storage element 101 is electrically connected to the bit line 103.

In a specific implementation, the first selective transistor 209 is configured to electrically connect the second end 207 of the storage element 101 with the bit line 103 in response to the first control signal in the write state.

In a specific implementation, the memory further includes: a write bit line 102; a second selective transistor 208 configured to electrically connect a first end 205 of the source line 204 with the write bit line 102 in response to a second control signal. The write bit line 102 and the first end 205 of the source line 204 are also controlled by the on-off of the second selective transistor 208. The memory is also configured to provide a high level or a low level to the first end 205 of the source line 204 with the write bit line 102 when the first end 205 of the source line 204 is electrically connected to the write bit line 102.

In a specific implementation, the memory further includes a third selective transistor 210 configured to transmit a high level or a low level to the second end of the source line 204 in response to a third control signal.

In a specific implementation, a first current Iwrite1 provided to the memory flows from the bit line 103 to the source line 204 and through the storage element 101 when writing 1; and flows from the source line 204 to the bit line 103 through the storage unit when writing 0. Please refer to the currents in FIGS. 2 and 3.

In a specific implementation, a second current Iwrite2 provided to the memory flows from the write bit line 102 to a second end of the source line 204 when writing 1; and flows from the second end of the source line 204 to the write bit line 102 when writing 0. Please refer to the currents in FIGS. 2 and 3.

In this specific implementation, the generation of the first current Iwrite1 and the second current Iwrite2 is achieved by controlling the voltages at three terminals of the memory such that there is voltage differences between the second end 207 of the storage element 101, the first end 205 of the source line 204, and the second end 206 of the source line 204. When the current is required to flow from the second end 207 of the storage element 101 to the second end 206 of the source line 204, or flow from the second end 206 of the source line 204 to the second end 207 of the storage element 101 is required, it is only necessary to control the voltage of the second end 207 of the storage element 101 to be higher than the voltage of the second end 206 of the source line 204, or the voltage of the second end 206 of the source line 204 to be higher than the voltage of the second end 207 of the storage element 101. When the current is required to flow from the first end 205 of the source line 204 to the second end 206 of the source line 204, or flow from the second end 206 of the source line 204 to the first end 205 of the source line 204, it is only necessary to control the voltage of the first end 205 of the source line 204 to be higher than the voltage of the second end 206, or the voltage of the second end 206 of the source line 204 to be higher than the voltage of the first end 205.

Note that the first current Iwrite1 and the second current Iwrite2 described above are classified by the path of the current. In fact, the currents may be classified according to the two states of writing 1 and writing 0.

In this specific implementation, since the first current Iwrite1 and the second current Iwrite2 are used simultaneously to control write 1 and write, and the second current Iwrite2 does not flow through the storage element 101, the current flowing through the storage element 101 during a write operation is reduced, guaranteeing that the current flowing through the storage element 101 during writing is not too large, and guaranteeing long-term reliability of the memory.

In a specific implementation, the read operation in the read and write method includes the steps of providing a third current Tread to the memory, the third current Tread flowing from the bit line 103 to a second end of the source line 204 through the storage element 101, and obtaining the storage state of the storage element 101 by detecting the magnitude of the third current Tread.

In a specific implementation, the storage element 101 comprises a magnetic tunnel junction. The magnetic tunnel junction has different resistances as the direction of the magnetic moment of the free layer 203 changes, and the storage element 101 storing 1 or 0 corresponds to different directions of the magnetic moment of the free layer 203. Therefore, the data stored in the storage element 101 may be read in combination with the resistance of the storage element 101 when the data stored in the storage element 101 is read by the third current Tread.

In a specific implementation, the timing in FIG. 5 may be used to represent changes in the levels of three terminals of the memory during reading and writing. Wherein, SL represents the voltage change at the second end 206 of the source line 204. In FIG. 5, when writing 1, the first control signal and the second control signal are both at a high level, the first selective transistor 209 and the second selective transistor 208 are both turned on, the bit line 103 provides a high level to the second end 207 of the storage element 101, and the write bit line 102 provides a high level to the first end 205 of the source line 204. A second end 206 of the source line 204 is at a low level. At this time, there is a first current Iwrite1 flowing from the second end 207 of the storage element 101 to the second end 206 of the source line 204, and there is also a second current Iwrite2 flowing from the first end 205 of the source line 204 to the second end of the source line 204.

In FIG. 5, when writing0, the first control signal and the second control signal are still at high level, the first selective transistors 209 and the second selective transistors 208 are still turned on, the bit line 103 provides a low level to the second end 207 of the storage element 101, and the write bit line 102 provides a low level to the first end 205 of the source line 204. A second end 206 of the source line 204 is at a high level. At this time, there is a first current Iwrite1 flowing from the second end 206 of the source line 204 to the second end 207 of the storage element 101, and there is also a second current Iwrite2 flowing from the second end 206 of the source line 204 to the first end 205 of the source line 204.

In FIG. 5, while reading, the first control signal is still at a high level and the second control signal is at a low level, at this time, the first selective transistor 209 is turned on, the second selective transistor 208 is turned off, and the second end 206 of the source line 204 is at a low level. At this time, a third current Iread flowing from the second end 207 of the storage element 101 to the second end 206 of the source line 204 is generated, and the memory state of the storage element 101 is obtained by detecting the magnitude of the third current Iread.

In the specific implementation shown in FIG. 5, there is also a standby state. In the standby, the first control signal and the second control signal are both at low levels, such that the first selective transistor 209 and the second selective transistor 208 are both turned off, the second end 206 of the source line 204 is always at a low level, there is no voltage difference among the three ports of the memory, and no current flows within the memory. In the specific implementation with a third selective transistor 210shown in FIG. 3, the third control signal controlling the third selective transistor 210 is also at a low level and the third selective transistor 210 is also turned off.

In a specific implementation of the above read and write method of memory, since a first current Iwrite1 flowing through a storage element 101 and a second current Iwrite2 not flowing through the storage element 101 are used simultaneously to perform a write operation on the storage element. The problem of excessive current by only using the STT current when writing is avoided, i.e., damage or degradation of the storage element 101 caused by applying a large current on the storage element 101 is avoided, thereby avoiding its influence on the performance and reliability of the memory. While in embodiments of the present disclosure, a write operation is performed by using a first current Iwrite1 and a second current Iwrite2it will be appreciated by those skilled in the art that, based on the same principle, the first current Iwrite1 and the second current Iwrite2 may also be used to perform other operations for changing the storage state, such as an erase operation.

What has been described above is merely the preferred embodiments of the present disclosure, and it should be noted that numerous improvements and modifications can be made to those skilled in the art without departing from the principles of the disclosure, which are also to be regarded as protective in the scope of the disclosure.

What is claimed is:

1. A memory, comprising:
    a storage unit, comprising a storage element;
    a source line, electrically connected to a first end of the storage element;
    a bit line; and
    a write bit line; wherein
    the storage unit further comprises:
    a first selective transistor, configured to electrically connect a second end of the storage element with the bit line in response to a first control signal;
    a second selective transistor, configured to electrically connect a first end of the source line with the write bit line in response to a second control signal; and
    a third selective transistor, configured to transmit a high level or a low level to a second end of the source line in response to a third control signal;
    when a write operation is performed on the memory, the first selective transistor, the second selective transistor and the third selective transistor are all turned on;
    when a read operation is performed on the memory, the first selective transistor and the third selective transistor are both turned on, and the second selective transistor is turned off;
    the memory is configured to change a storage state of the storage element by a first current and a second current that exist simultaneously during the write operation being performed, the first current flowing through the storage element and the second current flowing through the source line without flowing through the storage element; and
    the memory is further configured to read data stored within the storage element through a third current flowing from the bit line to the second end of the source line through the storage element.

2. The memory of claim 1, wherein the first current flows from the bit line to the source line through the storage element when 1 is written, and the first current flows from the source line to the bit line through the storage element when 0 is written.

3. The memory of claim 1, wherein the second current flows from the first end of the source line to the second end of the source line when 1 is written, and the second current flows from the second end of the source line to the first end of the source line when 0 is written.

4. The memory of claim 1, wherein the memory is further configured to provide the high level or the low level to the second end of the storage element by using the bit line, when the second end of the storage element is electrically connected with the bit line.

5. The memory of claim 1, wherein the memory is further configured to provide the high level or the low level to the first end of the source line by using the write bit line, when the first end of the source line is electrically connected with the write bit line.

6. The memory of claim 1, further comprising a plurality of storage units and the first end of the storage element in each of the plurality of storage units is connected to the source line.

7. The memory of claim 1, wherein the bit line is configured to provide the high level to the second end of the storage element when reading, and the second end of the source line is configured to be at the low level when reading.

8. The memory of claim 1, wherein the storage element comprises a magnetic tunnel junction.

9. The memory of claim 8, wherein, the magnetic tunnel junction comprises:
a free layer connected to the source line;
a non-magnetic isolation layer disposed on an upper surface of the free layer;
a fixed layer disposed on an upper surface of the non-magnetic insulating layer;
a direction of a magnetic moment of the free layer is variable and a direction of a magnetic moment of the fixed layer is fixed;
the first selective transistor is connected to the fixed layer.

10. A read and write method of a memory, wherein the memory comprises a storage unit; the storage unit comprises a storage element, a first selective transistor, a second selective transistor and a third selective transistor; the memory is configured to change a memory state of the storage element by a first current and a second current that are exist simultaneously; the memory further comprises a source line electrically connected to a first end of the storage element, a bit line and a write bit line; the first selective transistor is configured to electrically connect a second end of the storage element with the bit line in response to a first control signal; the second selective transistor is configured to electrically connect a first end of the source line with the write bit line in response to a second control signal; the third selective transistor is configured to transmit a high level or a low level to a second end of the source line in response to a third control signal; when performing a write operation on the memory, the method comprises:
simultaneously providing the first current and the second current to the memory during the write operation being performed;
wherein the first current flows through the storage element and the second current flows through the source line without flowing through the storage element, and the first selective transistor, the second selective transistor and the third selective transistor are all turned on; and
when performing a read operation on the memory, the method comprises:
providing a third current to the memory;
wherein the third current flows from the bit line to the second end of the source line through the storage element, the first selective transistor and the third selective transistor are both turned on, and the second selective transistor is turned off.

11. The read and write method of claim 10, wherein the bit line is capable of providing the high level or the low level to the second end of the storage element.

12. The read and write method of claim 10, wherein the write bit line is capable of providing the high level or the low level to the first end of the source line.

13. The read and write method of claim 11, wherein the first current flows from the bit line to the source line through the storage element when 1 is written; and the first current flows from the source line to the bit line through the storage element when 0 is written.

14. The read and write method of claim 12, wherein the second current flows from the write bit line to the second end of the source line when 1 is written; and the second current flows from the second end of the source line to the write bit line when 0 is written.

* * * * *